CONNECTOR FOR INTERCONNECTING PRINTED CIRCUIT BOARDS

Filed July 12, 1962

INVENTORS.
LEON L. DEER
ROBERT B. WHORTON III

BY Mead, Browne, Schuyler, and Beveridge

ATTORNEYS.

3,270,311
Patented August 30, 1966

3,270,311

CONNECTOR FOR INTERCONNECTING PRINTED CIRCUIT BOARDS

Leon L. Deer and Robert B. Whorton III, Huntsville, Ala., assignors to The Brown Engineering Company, Inc., Huntsville, Ala., a corporation of Alabama Filed July 12, 1962, Ser. No. 209,378
6 Claims. (Cl. 339—17)

This invention relates generally to connectors for printed circuit boards and modules and more particularly to circuit connector elements having removable solder lugs for facilitating the making of external wire connections to circuit boards at the connectors.

The development of solid-state amplifying devices and of modular construction, generally, has resulted in a large increase in the employment of circuit board modules based on rigid or semi-rigid circuit boards having various circuit components placed thereon by printing techniques, and the like. Oftentimes these circuit boards have perforations therethrough for the mounting of additional circuit components by soldering to the conductors along one surface of the circuit board. Such conductors extend to one end of the circuit board, which is thus adapted to be plugged in or clamped in some other manner to a terminal block serving as a circuit board interconnector.

The widespread use of such modules in computers and control circuits of various types has revealed the need for improved types of circuit board connector. Most such connectors have not been suitable for present day needs because of the restricted manner in which they may be assembled with a circuit board, or because of the limited types of mounting arrangement between the boards thus made possible. A still further need unfulfilled is a type of connector having external solder lugs in varied locations on a connector for detachable use between two circuit boards.

It is accordingly an object of this invention to provide a detachable interconnector device adaptable either to parallel or rectangular assembly of a pair of circuit boards.

A further object of the invention is to provide a circuit board connector including solder lugs as well as contacts for interconnecting the circuits of two boards.

A further object of the invention is to provide a connection to a circuit board having a plurality of solder lug connections to each of the contact elements detachably engaging circuits on the board.

A still further object of the invention is to provide a plurality of solder lug connections for each circuit interconnected between two circuit boards by a circuit board connector, in which the disposition of the solder lugs remaining on the finished assembly is variable simply by supplying extra lugs and clipping off the unneeded lugs.

Yet another object of the invention is to provide a removable metallic contact insert for a circuit board connector body to accomplish these objectives in an improved manner.

These and other objects of the invention are achieved by employing an insulating block generally of rectangular form and constructed to receive a number of metallic inserts each having a pair of spring contacts disposed to mate with, and bear against, the surface conductors of a pair of circuit boards so joined, and at the same time to employ a stem portion formed of the same piece as the contact member, extending through a hole in the block, and secured therein by means of a latching portion. The precision molding of such an insulating body provides channels for the contact members of carefully controlled size and shape to permit the use of a contact member possessing in each of the illustrated embodiments several novel features of general utility. A contact member is stamped from one piece of suitable material to include a pair of contact points disposed at the ends of a pair of contact arms, joined at the center to a stem portion and a latching portion with a plurality of solder lugs to extend along channels in the insulating block to positions external thereof, such that these solder lugs may be employed as desired or clipped off to avoid interference with immediately adjacent circuits in closely packed space.

The features and advantages of the invention will be better understood by reference to the drawings in which.

Figure 1:
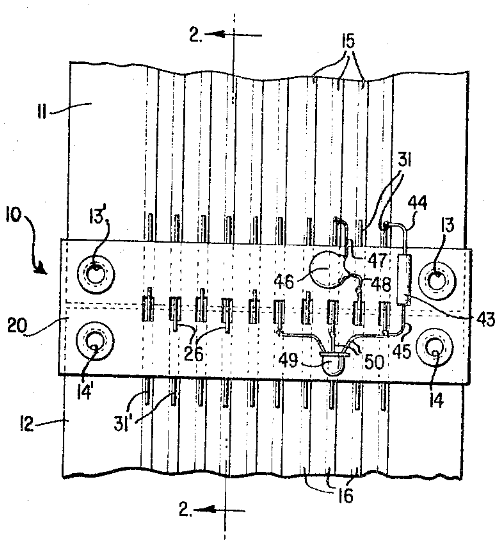
FIG. 1 is a plan view of one form of the circuit connector of this invention, shown attached to a pair of circuit boards arranged in a co-linear array.

Referring now to the drawings more in detail, it will be noted that a circuit connector block is illustrated generally at 10 attached to a pair of circuit boards 11 and 12 by means of screws inserted in screw holes 13 and 13' for the board 11, and 14 and 14' for the board 12. In this arrangement the two circuit boards 11 and 12 are arranged in abutting relation and the adjacent pairs of holes 13, 14 and 13', 14' permit securing the circuit boards together with conductors 15 on one of the boards co-linear with conductors 16 on the other board. The boards are held in alignment by machine screws or bolts 17 and 17' to form a joint at 19. Similarly, screws 18 and 18' secure circuit boards 11 and 12 in a right angle array at joint 19' as in FIGS. 4 and 6.

Figure 2:
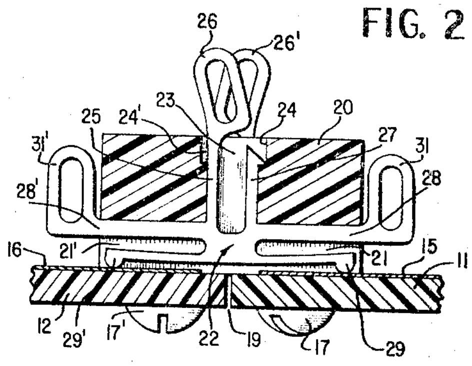
FIG. 2 is a cross-section of the circuit connector of FIG. 1 taken along line 2—2 of FIG. 1.

In FIG. 2 a rectangular block 20, constructed preferably of a rigid material of good insulating characteristics, good molding characteristics, and high strength, such as glass-filled diallyl phthalate, is provided with molded channels 21 and 21', co-extensively aligned across the lower surface of the block 20 at each position of desired connection between conductors 15 and 16 of the circuit boards attached to the lower surface thereof by screws 17 and 17'. The channels 21, 21' thus intersect the lower surface of block 20 as one continuous channel of depth sufficient to receive the laterally extending arms of a connector or contact element shown generally at 22, the contact element being slightly thinner than the width of the channel in order to provide free movement of the element within the channel. From the center of the contact element 22 a recess or molded perforation 23 extends to the opposite face of the block 20, being formed with a rectangular cross-section and being arranged at right angles to the surface of block 20 on which boards 11 and 12 are mounted. Recess 23 extends entirely through the block to an opposite face thereof and is preferably provided at opposite lateral extremities with cutaway portions as at 24 and 24' made generally alike to form ledge portions perpendicularly to the longitudinal extent of recess 23 from channel 21 to the opposite side of block 20. Contact member 22 has a stem portion 25 which extends from the center thereof in the vicinity of the junction 19 upwardly through recess 23 of block 20 and terminates in solder lug 26. Lug 26 is preferably angled somewhat from the shank of the stem portion 25 in order to lie at one side of the axis of the recess 23.

Each neighboring recess 23 of the block 10 receives a different element having a solder lug 26' which conveniently may be arranged in opposite orientation so that alternate solder lugs 26 and 26' are separated one from another because of the oppositely angular dispositions of the lugs as illustrated in FIG. 1, for increasing the available space for making soldered connections thereto.

Figure 3:
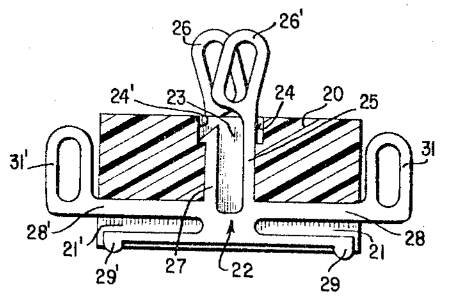
FIG. 3 illustrates the connector of FIG. 2 with the circuit boards and screws removed.

The stem portion 25 lies along one lateral extremity of recess 23 and a portion 27 lies along an opposite extremity of the recess such that the shank 25, bearing the lug 26, and the portion 27, bearing a retaining latch, form a bifurcated stem of parallel shank elements, that is, a U-shaped spring portion which is insertable into recess 23 to latch therein as portion 27 passes the ledge 24 or 24'. The recess is symmetrical and receives the stem in either of opposite orientations. The contact element 22 is further provided with a pair of lateral extensions 28 and 28' running along the bottom of the channels 21 and 21' past the lateral extremities of the block 20, terminating in the solder lugs 31 and 31' to form second and third connections for external wiring to the connector element 22. Extending generally parallel with the lateral extensions 28 and 28' are contact arms 29 and 29' arranged to lie in channels 21 and 21' and to have contact points at the ends thereof normally extending into the space occupied by circuit boards 11 and 12, when these boards are not in place, as illustrated in FIG. 3. When the circuit boards are secured to the block 20 by means of screws 17, 17' the arms 29 and 29' are deflected upwardly against the spring action of the contact member 22 to maintain a steady and reliable pressure against the contact elements 15 and 16 on the boards 11 and 12. Each lateral extension of the contact element is thust composed of two arms joined at the center to form a laterally extending U-shaped portion, and the entire contact element has three U-shaped members centrally joined, one arm of each serving as a fixed arm and the other as a spring portion, either to latch the stem in place or to serve as a contact arm engaging one circuit of a circuit board. The contact member 22 is preferably formed of some good conductor material such as beryllium-copper having high resistance to fatigue and other desirable characteristics for electrical contact springs. In order that the contacts will be entirely reliable and free from trouble for long periods of time, the contact element 22 is preferably gold-plated. Such gold plating prevents corrosion under atmospheric moisture conditions which would otherwise tend to prevent good contact between the contact arms 29 and 29' and conductors 15 and 16, or to cause uncertain contact at soldered connections on solder lug 26 or 31.

As previously noted, a circuit connector such as shown in FIGS. 1 and 2 is provided with three external solder connections in addition to the two spring contact connections to boards 11 and 12. This number of solder connections is not normally required in each case but is supplied as a means of facilitating mass-production of a generally useful contact element 22. Those solder lugs 26, 31 or 31' which are not needed in a particular interconnection between conductors 15 and 16 may be removed merely by clipping the undesired solder lug with a pair of diagonal pliers. It will further be noted that the construction of this contact element permits the ready replacement of one contact element by another merely by unlatching the retaining member 27 from the ledge in recess 23 and slipping the contact element from the channel.

Figure 4:
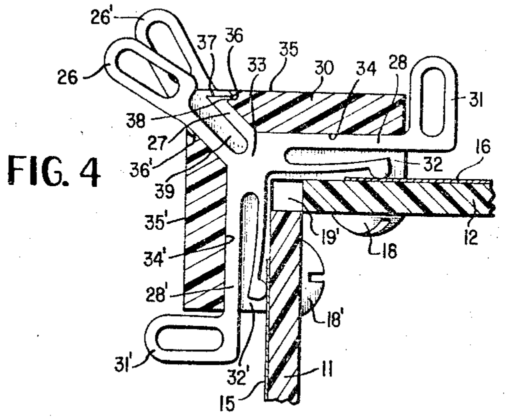
FIG. 4 is a sectional view of a modified form of the connector of this invention arranged to receive circuit boards at right angles.
Figure 5:
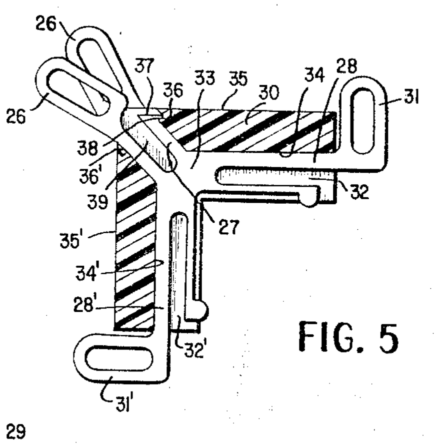
FIG. 5 illustrates the connector of FIG. 4 with the circuit boards and screws removed.
Figure 6:
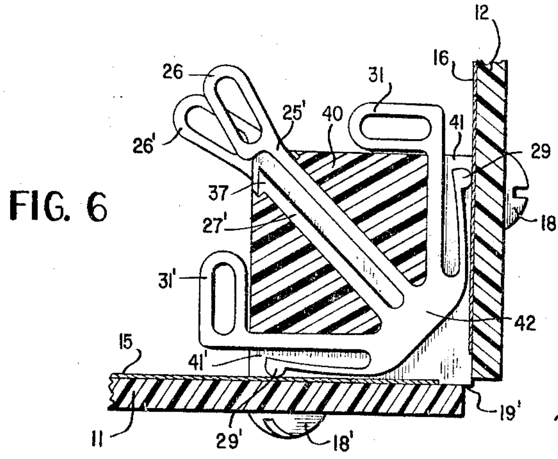
FIG. 6 illustrates another rectangular array of circuit boards on a block, arranged for external attachment of the boards thereto.

When it is desired to assemble two circuit boards at right angles a modified circuit block as shown at 30 in FIG. 4 may be employed, or a converse thereof as shown in FIG. 6. In FIG. 4, channels 32 and 32' are co-extensive as in FIG. 2 but are here disposed at right angles in order to receive the circuit boards 11 and 12 against the inner faces of a cutaway portion of the block 30. The contact element 33 is like the element 22, except that portions 28 and 28' are arranged at a 90° angle rather than in a straight line. Similarly, contact arms 29 and 29' are arranged parallel with 28 and 28' to form U-shaped portions in channels 32, 32' with contact points normally extending past the surface against which the circuit boards are to be attached. The channels 32 and 32' have inner or bottom surfaces 34 and 34' against which the lateral portions 28 and 28' of the contact members 33 are caused to rest when assembly is completed. The block 30 has faces 35 and 35' which are opposite to the faces receiving the circuit boards, the faces 35 and 35' being generally parallel with the bottoms of channels 34 and 34'. Similarly ledges 36 and 36' are provided at the outer extremity of the recess 39 in a manner similar to the arrangement of the ledges 24 and 24' of FIG. 2. The stem portion 25 terminates in the solder lug 26 as previously described being similarly provided with the latch portion 27, which preferably includes a sloping surface 37 adapting the contact element 33 to ready insertion within the recess 39, where it is retained by hooked engagement with the transverse ledge portion 38 or 38' as the contact element is seated in the channel and recess.

For some purposes it is desirable to connect circuit boards at right angles where the connection between the circuit boards is made internally to save space or to present a neater and stronger assembly. As illustrated in FIG. 6, block 40 is constructed with a pair of surfaces to receive the circuit boards on external adjacent surfaces running along the length of the block 40, being provided with channels 41 and 41' intersecting at right angles at one corner of the block. The circuit boards are attached to external surfaces of the block 40 by means of the screws 18 and 18' so as to meet at a junction position 19'. In this modification contact elements 42 includes like laterally extending arms 28 and 28' which bear solder lugs 31 and 31' as in the case of FIG. 4. The dimensions of the block 40 are such that the recess 39, extending from the junction of the contact arms 29 and 29' through the diagonal of the block, requires that the stem portion 25' bearing lug 26 and the portion 27' bearing the latch or hook must be made longer than in the case of element 33. The construction is otherwise similar to that shown in FIG. 4 in that the U-portions including contact arms 29 and 29' and the lug-bearing arms 28 and 28' are formed at 45° angles, respectively, to the central axis of the recess 39.

In each of the alternative forms the contact member comprises a plurality of fixed arms each held in the bottom of a formed channel, or at one side of a rectangular recess, and, each including a moveable spring-biased arm to form therewith a U-shaped portion in which the fixed arm supports the force exerted by the spring member, either to make the desired circuit board contact, or to urge the hook portion into retaining engagement with one face of the block or a transverse ledge proximate thereto.

While the invention has been described with reference to illustrated embodiments it is obvious that other modification and variations are possible in the light of this disclosure. It is therefore to be understood that the invention may be practiced otherwise than as specifically described within the scope of the appended claims.

We claim:

1. In a circuit board connector adapted for securing together two circuit boards and interconnecting selected pairs of circuits in like positions on the surfaces thereof, the combination comprising;

a dielectric body formed with perpendicular surfaces;

a transverse channel at each said position formed in the surface of said body;

a stem slot extending from each said channel through said body having therein a laterally extending ledge;

a metallic contact member formed in one piece and having a bifurcated stem portion in each said slot one branch thereof terminating at a solder lug extending beyond said body and a second branch thereof terminating in a spring latch for engaging said ledge and retaining said stem portion in said slot;

a pair of U-shaped spring contact portions of said member positioned one in each channel one arm of the U extending along said channel and terminating therebeyond in a solder lug and the other arm of the U lying within said channel exteriorly of said first arm and formed to normally protrude from said channel through said surface; and means for securing to said body a pair of circuit boards in position to interconnect the circuits of each of said pair and to provide said circuit pairs each with an external solder lug beyond said body.

2. In a circuit connector for interconnecting corresponding conductors of a pair of circuit boards and for connecting thereto wired circuit components;

a set of spring contact elements each including a pair of contacts for each circuit of said boards;

means supporting said elements in pressure-bearing relation on corresponding terminals of said pair of boards, including transverse channel means confining said contact elements to prealigned positions and a slot extending therefrom to an opposite side of the connector, said spring contact elements comprising a pair of U-shaped elements joined at the base and having one arm of each U-shaped element bottomed in said channel means and extending therebeyond to form a solder lug and having the opposite arm thereof formed at said contact element, said slot including parallel sides of which one side has a ledged portion, a stem portion integrally formed with each element of said set and having an extension removably inserted in said slot, a portion thereof extending therebeyond to serve as a solder lug, and a latch portion integrally formed with each said stem portion to include a portion parallel to the body of said stem and terminating in a hook portion extending transversely opposite to said stem portion, said latch portion and stem portion being located to occupy the width of said slot, whereby said hook portion engages said ledged side within said slot, to retain the stem portion in said supporting means.

3. In a circuit board connector comprising a plurality of connector members mounted each within a channel transversely formed within adjacent faces of an elongated insulator block to provide lands between said channels forming two circuit board-receiving faces along the block, each said channel in one said face meeting a corresponding channel of the other face and being thereat joined to a ledged perforation through said block, each said member comprising a U-shaped element extending along one said channel to include a resiliently positioned contact point on one arm of the U portion held normally exteriorly of said channel by a second arm of the U portion resting oppositely at the bottom of said channel, a U-shaped metallic element extending along said channel of the second face to include a resiliently positioned contact point on one arm of the U portion held normally exteriorly of said channel by a second arm of the U portion resting oppositely at the bottom of said channel, a bifurcated retaining member comprising a first metallic portion extending through said ledged perforation and electrically joining first and second said elements and a second metallic portion joined thereto including a latch urged against an opposite wall of said perforation and in position to engage the ledge thereof when said elements are fully inserted in said channels.

4. In a connector according to claim 3, said faces being coplanar, said perforation being perpendicular to said faces, said first and second elements being arranged at right angles to said retaining member and extending in opposite directions from said junction.

5. In a connector according to claim 3, said faces forming interior sides of an L-shaped connector, said perforation meeting each channel extending diagonally through said connector from said line, and said first and second elements extending therefrom at angles substantially 135° from said retaining member.

6. In a circuit board connector comprising a plurality of connector members mounted each within a channel transversely formed within adjacent faces of an elongated insulator block to provide lands between said channels forming two circuit board receiving faces along the block, each said channel in one said face meeting a corresponding channel of the other face and being thereat joined to a ledged perforation through said block, each said member comprising a U-shaped element extending along one said channel to include a resiliently positioned contact point on one arm of the U portion held normally exteriorly of said channel by a second arm of the U portion resting oppositely at the bottom of said channel, and extending laterally beyond the block to form a solder lug, a U-shaped metallic element extending along said channel of the second face to include a resiliently positioned contact point on one arm of the U portion held normally exteriorly of said channel by a second arm of the U portion resting oppositely at the bottom of said channel, a bifurcated retaining member comprising a first metallic portion extending through said ledged perforation and electrically joining first and second said elements and a second metallic portion joined thereto including a latch urged against an opposite wall of said perforation and in position to engage the ledge thereof when said elements are fully inserted in said channels.

References Cited by the Examiner

UNITED STATES PATENTS

| | | | |
|---|---|---|---|
| 2,533,483 | 12/1950 | Losquadro | 339—198 |
| 2,740,097 | 3/1956 | Edelman et al. | 339—17 |
| 2,765,450 | 10/1956 | Richardson | 339—176 |
| 2,832,942 | 4/1958 | French | 339—176 |
| 2,944,121 | 7/1960 | Wasylenko | 339—17 X |
| 3,026,494 | 3/1962 | Anderson | 339—17 |
| 3,047,832 | 7/1962 | Deakin | 339—217 |
| 3,192,498 | 6/1965 | Ruehlemann | 339—217 X |
| 3,215,968 | 11/1965 | Herrmann | 339—17 |

EDWARD C. ALLEN, *Primary Examiner.*

A. S. TRASK, *Assistant Examiner.*